(12) United States Patent
Park et al.

(10) Patent No.: US 10,868,093 B2
(45) Date of Patent: Dec. 15, 2020

(54) LIGHT EMITTING DIODE DISPLAY

(71) Applicant: Samsung Display Co., Ltd., Yongin-si (KR)

(72) Inventors: Gwui-Hyun Park, Hwaseong-si (KR); Chul Won Park, Hwaseong-si (KR); Bo Geon Jeon, Hwaseong-si (KR); Pil Soon Hong, Gwangmyeong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/250,144

(22) Filed: Jan. 17, 2019

(65) Prior Publication Data

US 2019/0245014 A1    Aug. 8, 2019

(30) Foreign Application Priority Data

Feb. 2, 2018    (KR) .......................... 10-2018-0013569

(51) Int. Cl.
*H01L 27/32*    (2006.01)
*H01L 51/52*    (2006.01)

(52) U.S. Cl.
CPC ...... *H01L 27/3246* (2013.01); *H01L 27/3244* (2013.01); *H01L 27/3248* (2013.01); *H01L 27/3258* (2013.01); *H01L 27/3276* (2013.01); *H01L 51/5225* (2013.01); *H01L 2227/323* (2013.01); *H01L 2251/5392* (2013.01)

(58) Field of Classification Search
CPC ..... H01L 51/50; H01L 51/52; H01L 51/5203; H01L 51/5209; H01L 51/5212; H01L 51/5215; H01L 51/5225; H01L 51/5228; H01L 27/3241; H01L 27/3244; H01L 27/3246; H01L 27/3248; H01L 27/3258; H01L 27/32; H01L 27/3223;
(Continued)

(56) References Cited

U.S. PATENT DOCUMENTS 7,948,168 B2 *    5/2011    Park .................... H01L 27/3246
                                                                    313/504
8,591,280 B2 *    11/2013    Kwon ................ H01L 27/3248
                                                                    445/25
(Continued)

FOREIGN PATENT DOCUMENTS

KR        10-0669766 B1    1/2007
KR        10-0919352 B1    9/2009
(Continued)

OTHER PUBLICATIONS

The extended European search report for the corresponding European Application No. 19154971.6 dated Jun. 18, 2019.

*Primary Examiner* — Eduardo A Rodela
(74) *Attorney, Agent, or Firm* — Kile Park Reed & Houtteman PLLC

(57) ABSTRACT

A light emitting diode display includes a first electrode, a second electrode overlapping the first electrode, a light emission layer between the first electrode and the second electrode, a pixel defining layer overlapping a part of the first electrode, the pixel defining layer and the light emission layer being spaced apart from each other in a top view, and an inorganic layer between the first electrode and the light emission layer, and an edge of the inorganic layer overlapping the light emission layer and the pixel defining layer.

5 Claims, 18 Drawing Sheets

(58) Field of Classification Search
CPC .............. H01L 27/326; H01L 27/3276; H01L 27/3283; H01L 27/3288
See application file for complete search history.

(56) References Cited

U.S. PATENT DOCUMENTS

| | | | | |
|---|---|---|---|---|
| 10,665,811 | B2* | 5/2020 | Park | H01L 51/5203 |
| 2002/0063515 | A1* | 5/2002 | Goto | H01L 27/3258 |
| | | | | 313/500 |
| 2005/0200273 | A1* | 9/2005 | Nozawa | H01L 27/3246 |
| | | | | 313/503 |
| 2015/0179719 | A1 | 6/2015 | Nam et al. | |
| 2016/0218318 | A1 | 7/2016 | Chung et al. | |
| 2016/0322437 | A1* | 11/2016 | Sakamoto | H01L 27/3246 |
| 2017/0271421 | A1* | 9/2017 | Jinbo | H01L 27/3258 |

FOREIGN PATENT DOCUMENTS

| | | |
|---|---|---|
| KR | 10-1431338 B1 | 8/2014 |
| KR | 10-2016-0009400 A | 1/2016 |

* cited by examiner

LIGHT EMITTING DIODE DISPLAY

CROSS-REFERENCE TO RELATED APPLICATION

Korean Patent Application No. 10-2018-0013569, filed on Feb. 2, 2018, in the Korean Intellectual Property Office, and entitled: "Light Emitting Diode Display," is incorporated by reference herein in its entirety.

BACKGROUND

1. Field

The present disclosure relates to a light emitting diode display.

2. Description of the Related Art

A light emitting diode display includes two electrodes and a light emission layer positioned therebetween. An electron injected from a cathode, which is one of the two electrodes, and a hole injected from an anode, which is the other of the two electrodes, are coupled to each other in the light emission layer to form an exciton. The exciton emits light while emitting energy.

The light emitting diode display includes a plurality of pixels having light emitting diodes including the cathodes, the anodes, and the light emission layers. Each pixel includes a transistor and a capacitor for driving the light emitting diode.

SUMMARY

An exemplary embodiment provides a light emitting diode display including a first electrode, a second electrode overlapping with the first electrode, a light emission layer positioned between the first electrode and the second electrode, a pixel defining layer overlapping with a part of the first electrode, and an inorganic layer positioned between the first electrode and the light emission layer, in which the light emission layer and the pixel defining layer are spaced apart from each other on a plane, and the edge of the inorganic layer overlaps with the light emission layer and the pixel defining layer.

The light emission layer may be surrounded by the first electrode, the inorganic layer, and the second electrode.

The edge of the light emission layer and the edge of the pixel defining layer may be positioned on one surface of the inorganic layer.

The second electrode may be in contact with the inorganic layer in a region spaced between the pixel defining layer and the light emission layer.

The inorganic layer may overlap with the pixel electrode.

The light emitting diode display may further include a thin film transistor connected with the first electrode; and a planarization layer positioned on the thin film transistor, in which a part of the inorganic layer may be positioned between the pixel defining layer and the planarization layer.

Another exemplary embodiment also provides a light emitting diode display including a first electrode connected with a thin film transistor, a second electrode overlapping with the first electrode, a light emission layer positioned between the first electrode and the second electrode, a pixel defining layer overlapping with the thin film transistor, and an inorganic layer positioned between the first electrode and the light emission layer, in which the light emission layer and the pixel defining layer may be spaced apart from each other on a plane and the inorganic layer and the pixel defining layer may be spaced apart from each other on a plane.

The inorganic layer may overlap with the edge of the light emission layer and the edge of the pixel electrode.

The inorganic layer may cover the edge of the pixel electrode.

The light emitting diode display may further include a planarization layer positioned on the thin film transistor, in which the second electrode may be in contact with the planarization layer.

Yet another exemplary embodiment provides a light emitting diode display including a first electrode, a second electrode overlapping with the first electrode, a light emission layer positioned between the first electrode and the second electrode, an auxiliary layer positioned between the first electrode and the second electrode and spaced apart from the light emission layer, an inorganic layer positioned between the light emission layer and the first electrode, and a pixel defining layer positioned between the first electrode and the auxiliary layer, in which the inorganic layer may overlap with the edge of the light emission layer and the edge of the auxiliary layer.

The light emission layer may include at least one of a hole transport region and a hole injection region, a light emission region, and at least one of an electron transport region and an electron injection region.

The first electrode may be an anode and the auxiliary layer may include at least one of the hole transport region and the hole injection region.

The first electrode may be a cathode, and the auxiliary layer may include at least one of the electron transport region and the electron injection region.

The auxiliary layer may be positioned on a side surface of the pixel defining layer.

The light emission layer and the pixel defining layer may be spaced apart from each other on a plan.

The second electrode may be in contact with the inorganic layer in a region spaced between the auxiliary layer and the light emission layer.

The pixel defining layer and the inorganic layer may be spaced apart from each other on a plane.

The first electrode may be in contact with the auxiliary layer in a region spaced between the pixel defining layer and the inorganic layer.

One pixel may include at least two auxiliary layers which are spaced apart from each other.

The inorganic layer may further include a protrusion positioned between the two auxiliary layers which are spaced apart from each other, The inorganic layer may include at least two protrusions.

The protrusion may overlap with the pixel defining layer.

The light emission layer may further include a hole injection region and an electron injection region, and the auxiliary layer may include one to four regions selected from the hole transport region, the hole injection region, the light emission region, the electron injection region and the electron transport region.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
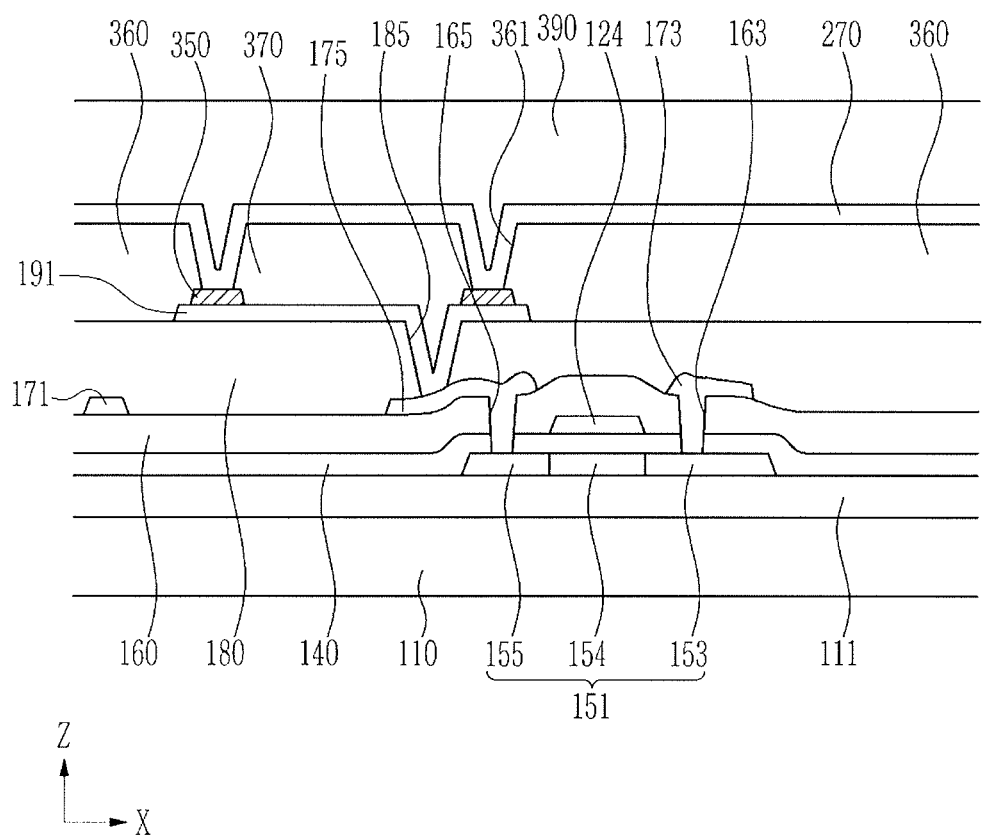
FIG. 1 illustrates a cross-sectional view of a light emitting diode display according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
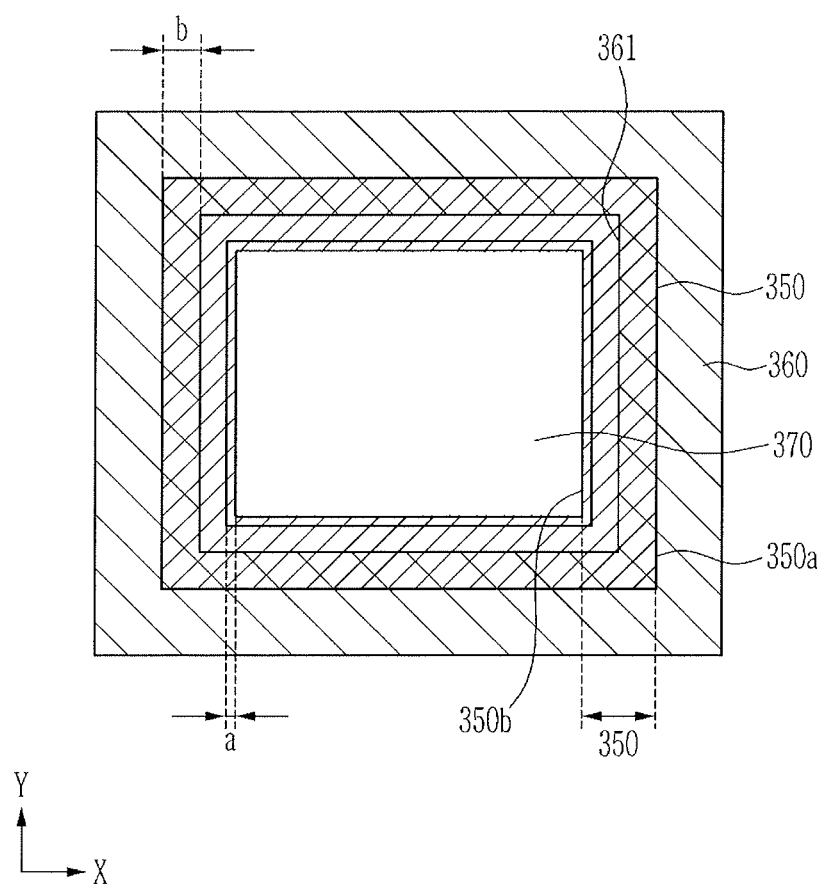
FIG. 2 illustrates a schematic partial plan view for some components of FIG. 1.

Hereinafter, a light emitting diode display according to an exemplary embodiment will be described with reference to FIGS. 1 and 2. FIG. 1 is a cross-sectional view of a light emitting diode display according to an exemplary embodiment, and FIG. 2 is a schematic plan view for some components of FIG. 1. It is noted that some elements are eliminated form FIG. 2 to better illustrate the relative structures of elements 350, 360, and 370.

Referring to FIGS. 1 and 2, a light emitting diode display according to an exemplary embodiment may include a buffer layer 111 positioned on a substrate 110. The buffer layer 111 may overlap with the entire surface of the substrate 110. The buffer layer 111 may include an inorganic material, e.g., silicon oxide ($SiO_x$) and silicon nitride ($SiN_x$). The buffer layer 111 may be a single layer or a multiple layer. The buffer layer 111 may planarize one surface of the substrate 110 or prevent diffusion of impurities which degrade characteristics of a semiconductor layer 151 to be described below and prevent penetration of moisture and the like. According to an exemplary embodiment, the buffer layer 111 may be omitted.

A semiconductor layer 151 of a thin film transistor may be positioned on the buffer layer 111. The semiconductor layer 151 includes a channel region 154, and a source region 153 and a drain region 155 which are positioned at both sides of the channel region 154 and doped. The semiconductor layer 151 may include, e.g., polycrystalline silicon, amorphous silicon, or an oxide semiconductor.

A gate insulating layer 140 is positioned on the semiconductor layer 151. The gate insulating layer 140 may overlap with the entire surface of the substrate 110. The gate insulating layer 140 may include an inorganic insulating material, e.g., silicon oxide ($SiO_x$) and silicon nitride ($SiN_x$).

A gate conductor including a gate electrode 124 of the thin film transistor is positioned on the gate insulating layer 140. The gate electrode 124 may overlap with the channel region 154 of the semiconductor layer 151. An interlayer insulating layer 160 including an inorganic insulating material or organic insulating material is positioned on the gate electrode 124.

A data conductor including a source electrode 173 and a drain electrode 175 of the thin film transistor, a data line 171, a driving voltage line, and the like is positioned on the interlayer insulating layer 160. The source electrode 173 and the drain electrode 175 may be connected to the source region 153 and the drain region 155 of the semiconductor layer 151 through contact holes 163 and 165 of the interlayer insulating layer 160 and the gate insulating layer 140, respectively.

The gate electrode 124, the source electrode 173, and the drain electrode 175 form the thin film transistor together with the semiconductor layer 151. The illustrated thin film transistor may be a driving transistor included in one pixel of the light emitting diode display. The illustrated thin film transistor may be called a top-gate transistor because the gate electrode 124 is positioned above the semiconductor layer 151. However, the structure of the transistor is not limited thereto and may be variously changed, e.g., the gate electrode may also be a bottom-gate transistor positioned below the semiconductor layer.

A planarization layer 180 may be positioned on the interlayer insulating layer 160 and the data conductor. The planarization layer 180 may serve to remove and planarize a step in order to enhance light emission efficiency of a light emitting element to be formed thereon. The planarization layer 180 may overlap with the thin film transistor and cover the thin film transistor.

The planarization layer 180 may include, e.g., an organic insulating material. The organic insulating material may include, e.g., polyimide, polyamide, polyacrylate, polyphenylene ether, polyphenylene sulfide, unsaturated polyester, epoxy resin, phenol resin, and the like, but is not limited thereto.

A pixel electrode 191 may be positioned on the planarization layer 180. The pixel electrode 191 may be connected with the drain electrode 175 of the thin film transistor through a contact hole 185 of the planarization layer 180.

The pixel electrode 191 may include an inorganic material that is, e.g., a reflective conducting material, a semi-transmissive conducting material, or a transparent conducting material. For example, the pixel electrode 191 may include at least one of transparent conducting materials, e.g., indium tin oxide (ITO) and indium zinc oxide (IZO), and metals, e.g., lithium (Li), calcium (Ca), aluminum (Al), silver (Ag), magnesium (Mg), and gold (Au).

A pixel defining layer 360 may be positioned on the planarization layer 180 and the pixel electrode 191. The pixel defining layer 360 may overlap with a part of the pixel electrode 191, e.g., along the X and Z directions.

The pixel defining layer 360 has an opening 361 overlapping with a part of the pixel electrode 191. The opening 361 of the pixel defining layer 360 may limit a region corresponding to the pixel. The pixel defining layer 360 may include an organic insulating material, e.g., polyimide, polyacrylate, and polyamide, but is not limited thereto.

An inorganic layer 350 is positioned between the pixel defining layer 360 and the pixel electrode 191. As illustrated in FIG. 1, the inorganic layer 350 may be positioned to overlap with an edge of a light emission layer 370 to be described below, and with an edge of the pixel defining layer 360. For example, as illustrated in FIG. 2, a first edge 350a of the inorganic layer 350 may overlap with the pixel defining layer 360 and a second edge 350b may overlap with the light emission layer 370, e.g., the first edge 350a may be an outer edge completely surrounding the second edge 350b.

As illustrated in FIG. 1, the edge of the pixel defining layer 360 and the edge of the light emission layer 370 may be positioned on a first surface, e.g., an upper surface, of the inorganic layer 350. A second surface of the inorganic layer 350, e.g., a lower surface of the inorganic layer 350 opposite the first surface, may face the pixel electrode 191. For example, as illustrated in FIG. 1, the edge of the pixel defining layer 360 may continuously cover a portion of the upper surface and the lateral surface of the first edge of the inorganic layer 350 (part 'b' in FIG. 2), and the edge of the light emission layer 370 may continuously cover a portion of the upper surface and the lateral surface of the second edge of the inorganic layer 350 (part 'a' in FIG. 2). For example, as illustrated in FIG. 2, the overlap between edges of the pixel defining layer 360 and the inorganic layer 350, as well as the overlap between edges of the light emission layer 370 and the inorganic layer 350, may be continuous along both X and Y directions. The inorganic layer 350 may include any inorganic material, e.g., silicon oxide ($SiO_x$), silicon nitride ($SiN_x$), and the like.

A width between the light emission layer 370 and the pixel defining layer 360, which are positioned on the upper surface of the inorganic layer 350, may be about 0.1 μm or more, e.g., about 0.5 μm or more. In particular, a width of a region which does not overlap with the light emission layer 370 and the pixel defining layer 360 on the upper surface of the inorganic layer 350 may be about 0.1 μm or more, e.g., about 0.5 μm or more. However, the width is not limited thereto and may be changed according to a process of manufacturing each component.

The light emission layer 370 is positioned on the pixel electrode 191 and the inorganic layer 350. The light emission layer 370 includes a light emission region. The light emission layer 370 may further include at least one of a hole injection region, a hole transport region, an electron injection region, and an electron transport region.

The light emission layer 370 may include an organic material which uniquely emits light having a basic color such as red, green and blue. Alternatively, the light emission layer 370 may also have a structure in which a plurality of organic materials emitting light having different colors is stacked. Alternatively, the light emission layer 370 may include an inorganic material emitting light of red, green and blue.

The light emission layer 370 does not overlap with the pixel defining layer 360 on a plane, i.e., the light emission layer 370 does not overlap an upper surface of the pixel defining layer 360 along a vertical direction. The light emission layer 370 and the pixel defining layer 360 may be spaced apart from each other along a horizontal direction, e.g., along the x direction. The light emission layer 370 may overlap with a part of the inorganic layer 350, e.g., the light emission layer 370 may overlap with a part of the upper surface of the inorganic layer 350 and extend along the lateral side of the inorganic layer 350. The edge of the light emission layer 370 may overlap with the inorganic layer 350.

A common electrode 270 transmitting a common voltage is positioned on the light emission layer 370. For example, the common electrode 270 may include an inorganic material that is a transparent conducting material, e.g., indium tin oxide (ITO) and indium zinc oxide (IZO). In another example, the common electrode 270 may also be formed of an inorganic material by thinly stacking metals, e.g., calcium (Ca), barium (Ba), magnesium (Mg), aluminum (Al), silver (Ag), and the like to have light transmissivity. Although not illustrated, at least one protective layer or functional layer may be positioned on the common electrode 270. For example, as illustrated in FIG. 1, the common electrode 270 may extend continuously on, e.g., directly on, the light emission layer 370, the pixel defining layer 360, and a region between the light emission layer 370 and the pixel defining layer 360.

In detail, as illustrated in FIG. 1, the common electrode 270 may overlap with the inorganic layer 350. Particularly, the common electrode 270 may be in contact with a portion of the inorganic layer 350 which is exposed between the pixel defining layer 360 and the light emission layer 370. For example, as illustrated in FIG. 1, the common electrode 270 may extend continuously and conformally on lateral sides of the light emission layer 370 and the pixel defining layer 360, and on the upper surface of the inorganic layer 350 exposed between facing lateral sides of the light emission layer 370 and the pixel defining layer 360.

In a comparative embodiment, e.g., when the inorganic layer 350 is not formed, the common electrode 270 could contact the pixel electrode 191 in a region between the light emission layer 370 and the pixel defining layer 360. In contrast, in accordance with embodiments, as the inorganic layer 350 is positioned in an exposed region between the light emission layer 370 and the pixel defining layer 360, the inorganic layer 350 prevents contact between the common electrode 270 and the pixel electrode 191.

The pixel electrode 191, the light emission layer 370, and the common electrode 270 of each pixel form a light emitting element which is a light emitting diode. For example, the pixel electrode 191 may be an anode which is a hole injection electrode, and the common electrode 270 may be a cathode which is an electron injection electrode. In another example, the pixel electrode 191 may be the cathode and the common electrode 270 may be the anode. A hole and an electron are injected into the light emission layer 370 from the pixel electrode 191 and the common electrode 270, respectively, and an exciton formed by coupling the injected hole and electron falls from an excited state to a ground state to emit light.

A thin film encapsulation layer 390 may be positioned on the common electrode 270. The thin film encapsulation layer 390 may include a plurality of inorganic layers or a structure in which inorganic layers and organic layers are alternately stacked.

The inorganic layer may include metal oxide or metal nitride. As one example, the inorganic layer may include any one of $SiN_x$, $Al_2O_3$, $SiO_2$, and $TiO_2$. The organic layer may include a polymer, e.g., any one of polyethylene terephthalate, polyimide, polycarbonate, epoxy, polyethylene and polyacrylate.

In this specification, an example in which the thin film encapsulation layer 390 is positioned directly on the common electrode 270 is illustrated, but embodiments are not limited thereto. For example, a separate filling material, a separate adhesive material, and the like may be positioned between the common electrode 270 and the thin film encapsulation layer 390.

The light emitting diode display according to the exemplary embodiment includes the light emission layer 370, e.g., completely, surrounded by inorganic material. That is, referring to FIG. 1, a lower surface of the light emission layer 370 may overlap with the inorganic layer 350 and the pixel electrode 191. In addition, a side, e.g., lateral, surface of the light emission layer 370 may overlap with the common electrode 270. In addition, an upper surface of the light emission layer 370 may overlap with the common electrode 270. The light emission layer 370 according to the exemplary embodiment may be surrounded, e.g., completely enclosed, by the pixel electrode 191, the inorganic layer 350, and the common electrode 270, all of which include, e.g., consist of, inorganic materials.

When an element or layer includes an organic material, e.g., the pixel defining layer 360, gas may be generated by the manufacturing process, sunlight, or the like, and is referred to as outgas. When the generated outgas is introduced into the light emission layer 370, the light emission layer 370 may be contaminated or contracted. However, according to embodiments, since the light emission layer 370 is, e.g., completely, surrounded by an inorganic material, outgas generated from organic materials in the light emitting diode display layer is prevented from being introduced into the light emission layer 370. Therefore, it is possible to reduce contamination and contraction of the light emission layer 370 and improve reliability of a display device including the light emission layer 370.

Figure 3:
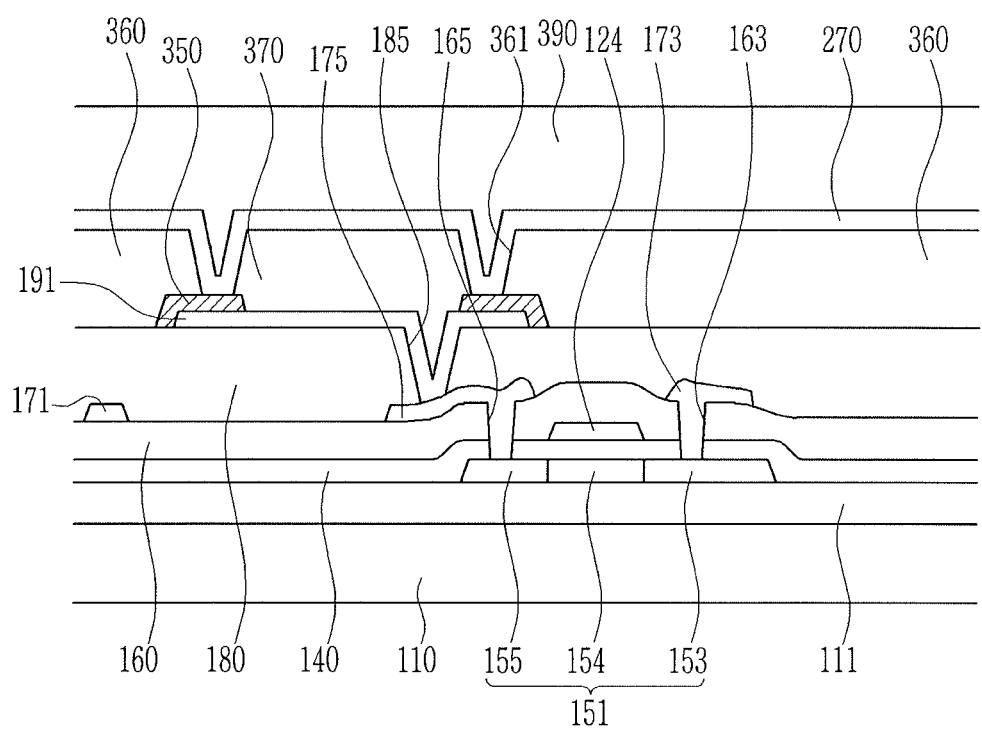
FIGS. 3 and 4 illustrate cross-sectional views of a light emitting diode display according to modified examples of FIG. 1, respectively.
Figure 4:
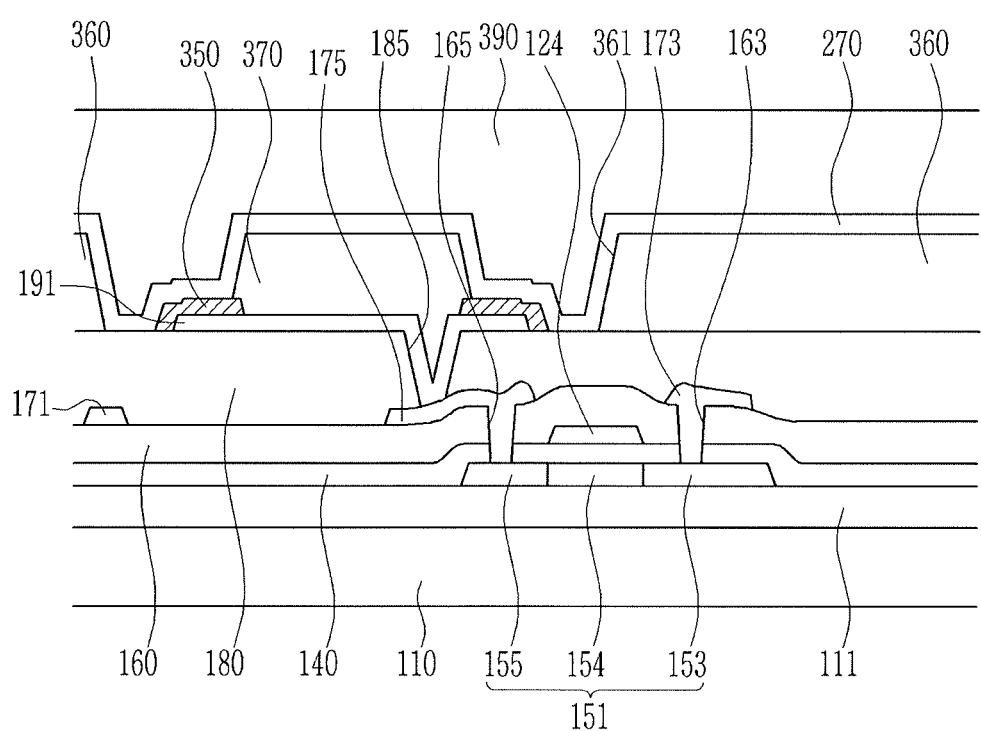

Hereinafter, a light emitting diode display according to an exemplary embodiment will be described with reference to FIGS. 3 and 4. FIGS. 3 and 4 are cross-sectional views of a light emitting diode display according to a modified example of FIG. 1, respectively. The description of the same components as the components described with reference to FIGS. 1 and 2 will be hereinafter omitted.

Referring to FIG. 3, the inorganic layer 350 may be positioned on the planarization layer 180 and the pixel electrode 191. That is, a part of the inorganic layer 350 may be positioned on the pixel electrode 191 and the remaining part of the inorganic layer 350 may be positioned on the planarization layer 180, e.g., the inorganic layer 350 may have a cross-section of a L-shape that continuously extends along a part of an upper surface of the pixel electrode 191 and along a lateral surface of the pixel electrode 191 to contact the planarization layer 180. A part of the inorganic layer 350 may be positioned between the pixel defining layer 360 and the planarization layer 180. According to an exemplary embodiment, the inorganic layer 350 may be in contact with the planarization layer 180.

An end of the inorganic layer 350 may cover an end of the pixel electrode 191. The inorganic layer 350 may overlap with an edge of the pixel electrode 191. In this specification, an example in which the end of the inorganic layer 350 fully covers the end of the pixel electrode 191 is described, but embodiments are not limited thereto. That is, in FIG. 3, the inorganic layer 350 positioned at a right side covers the right end of the pixel electrode 191 and the inorganic layer 350 positioned at a left side not covers the left end of the pixel electrode 191. However, other embodiments, e.g., partial coverage of each edge of the pixel electrode 191 or coverage of only some of the edges of the pixel electrode 191, are also included.

Referring to FIG. 4, the inorganic layer 350 according to the exemplary embodiment may be positioned on the pixel electrode 191 and the planarization layer 180. That is, the inorganic layer 350 may cover the end of the pixel electrode 191. The inorganic layer 350 may overlap with the edge of the pixel electrode 191. The pixel electrode 191 may be covered by the light emission layer 370 and the inorganic layer 350 and is not in contact with the common electrode 270.

The inorganic layer 350 may overlap with the light emission layer 370. The edge of the inorganic layer 350 may overlap with the light emission layer 370. The edge of the light emission layer 370 may be positioned on one surface of the inorganic layer 350.

According to an exemplary embodiment, the pixel defining layer 360 may be spaced apart from the light emission layer 370. In addition, the pixel defining layer 360 may also be spaced apart from the inorganic layer 350. The planarization layer 180 may be exposed in the spaced region between the pixel defining layer 360 and the inorganic layer 350. In the spaced region, the planarization layer 180 may be in contact with the common electrode 270.

According to the exemplary embodiment of FIG. 4, an upper surface and a side surface of the light emission layer 370 are surrounded by the common electrode 270 and a lower surface of the light emission layer 370 is surrounded by the inorganic layer 350 and the pixel electrode 191. The light emission layer 370 is surrounded by the inorganic material to prevent deterioration of performance due to penetration of outgas.

Figure 5:
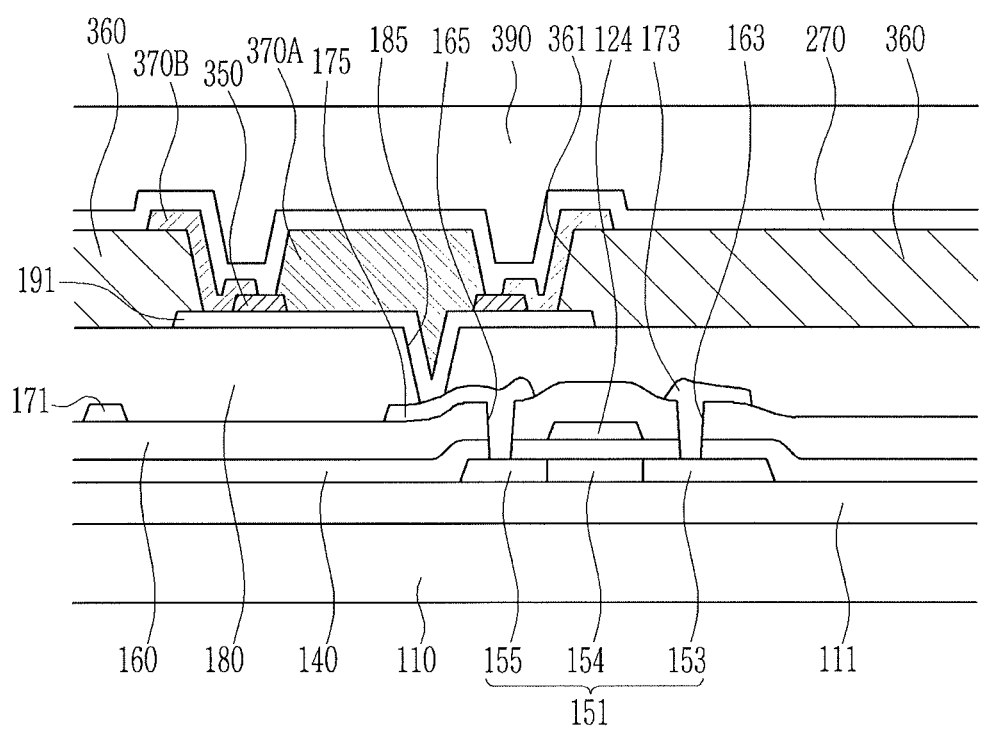
FIG. 5 illustrates a cross-sectional view of a light emitting diode display according to an exemplary embodiment.
Figure 6:
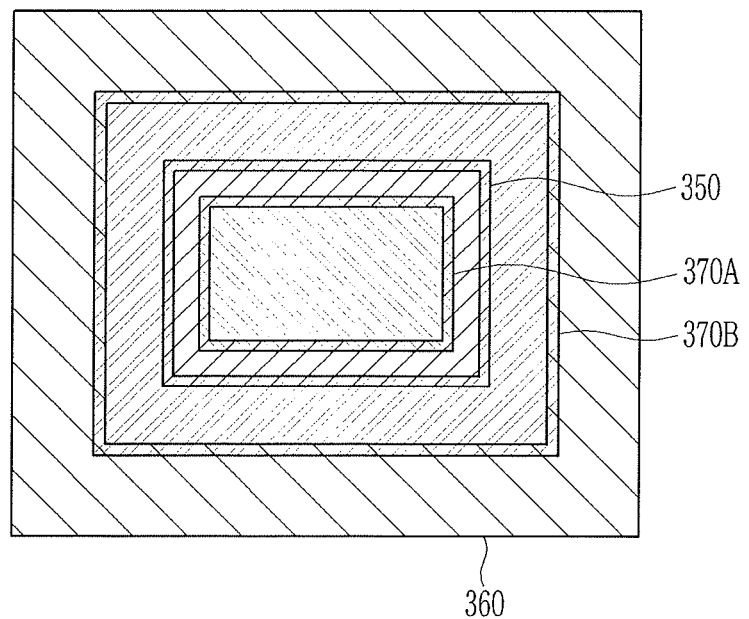
FIG. 6 illustrates a partial plan view for some components of FIG. 5.
Figure 7:
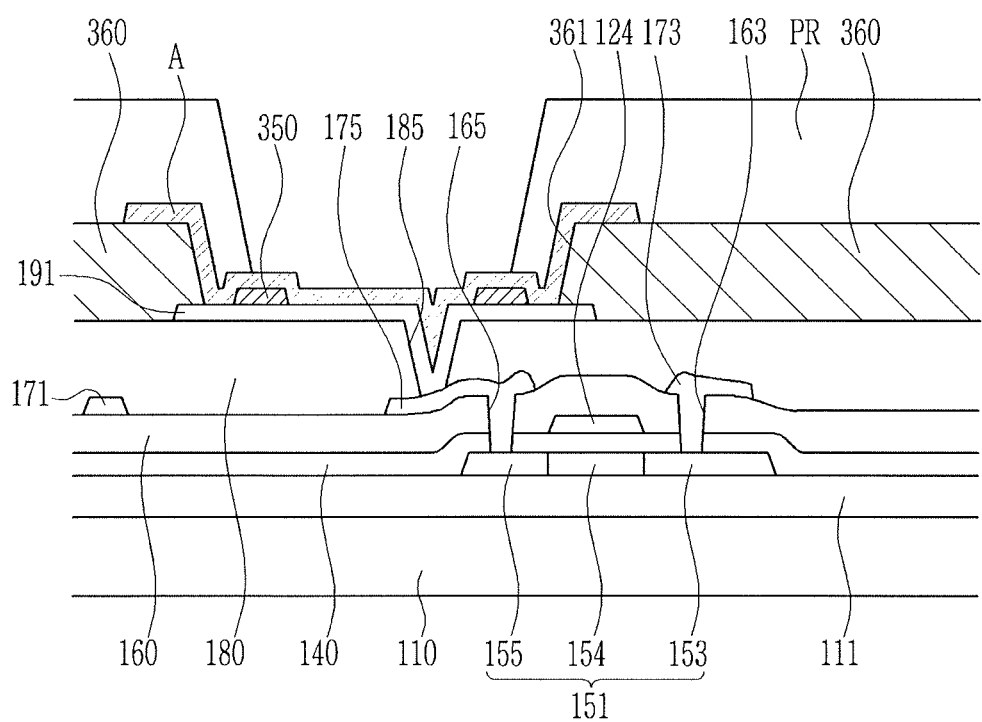
FIGS. 7 and 8 illustrate cross-sectional views of stages in a manufacturing method of the light emitting diode display in FIG. 5.
Figure 8:
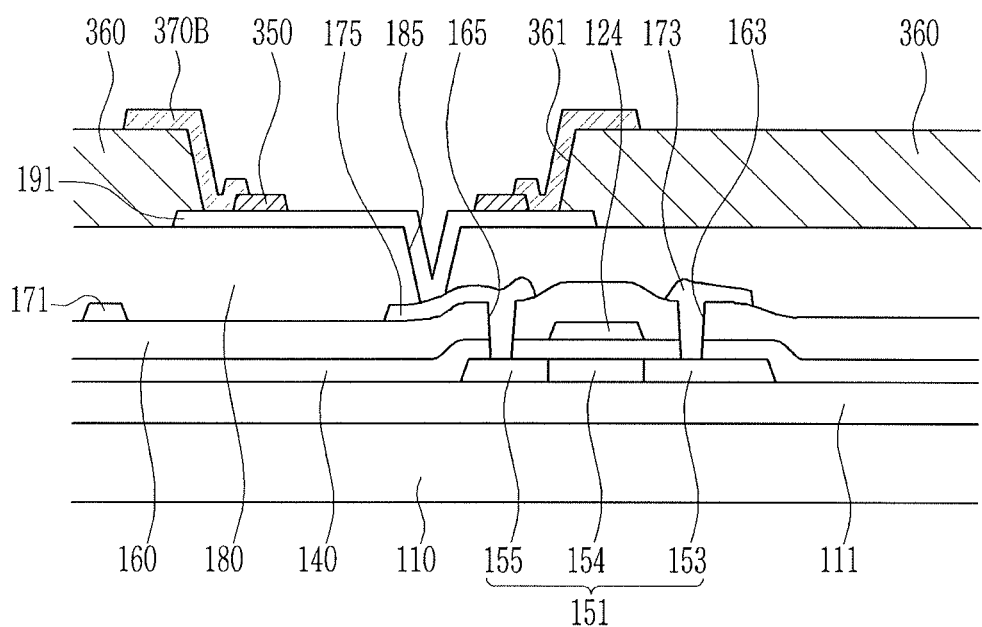

Hereinafter, a light emitting diode display according to embodiments will be described with reference to FIGS. 5 to 8. FIG. 5 is a cross-sectional view of a light emitting diode display according to an exemplary embodiment, FIG. 6 is a partial plan view for some components of FIG. 5, and FIGS. 7 and 8 are cross-sectional views of stages in a manufacturing method of the light emitting diode display according to the exemplary embodiment of FIG. 5. The same or similar exemplary embodiment as or to the aforementioned exemplary embodiment will be described hereinafter.

Referring to FIGS. 5 and 6, the inorganic layer 350 is positioned on the pixel electrode 191. The inorganic layer 350 may be positioned to overlap with an edge a light emission layer 370A to be described below. In addition, the inorganic layer 350 may overlap with an edge of an auxiliary layer 370B. The edge of the inorganic layer 350 may overlap with the light emission layer 370A and the auxiliary layer 370B.

The light emission layer 370A is positioned on the pixel electrode 191 and the inorganic layer 350. The auxiliary layer 370B is positioned on the pixel electrode 191, the inorganic layer 350, and the pixel defining layer 360.

The light emission layer 370A according to the exemplary embodiment includes a light emission region. In addition, the light emission layer 370A may further include at least one of a hole injection region, a hole transport region, an electron injection region, and an electron transport region which are sequentially positioned from the pixel electrode 191.

The edge of the light emission layer 370A may be positioned on one surface of the inorganic layer 350. The lower surface of the light emission layer 370A may overlap with the pixel electrode 191 and the inorganic layer 350 and the side surface and the upper surface of the light emission layer 370A may overlap with the common electrode 270. The light emission layer 370A according to the exemplary embodiment may be surrounded by layers made of inorganic materials. The performance of the light emitting element may be improved by preventing outgas and the like from being introduced to the light emission layer 370A.

On a plane, the pixel defining layer 360 and the light emission layer 370A may be spaced apart from each other. The inorganic layer 350 and the auxiliary layer 370B may be positioned between the spaced pixel defining layer 360 and light emission layer 370A.

The auxiliary layer 370B may overlap with the pixel defining layer 360 and the inorganic layer 350 and may be spaced apart from the light emission layer 370A. The common electrode 270 may be positioned on the inorganic layer 350 in the spaced region between the auxiliary layer 370B and the light emission layer 370A. According to an exemplary embodiment, the common electrode 270 may be in contact with the inorganic layer 350.

The auxiliary layer 370B may overlap with the side surface and a part of the upper surface of the pixel defining layer 360. According to an exemplary embodiment, the auxiliary layer 370B may be positioned only on the side surface of the pixel defining layer 360 and may not be positioned on the upper surface of the pixel defining layer 360.

The inorganic layer 350 may overlap with the light emission layer 370A and the auxiliary layer 370B and may be spaced apart from the pixel defining layer 360. The auxiliary layer 370B may be positioned on the pixel electrode 191 in the spaced region between the inorganic layer 350 and the pixel defining layer 360. According to an exemplary embodiment, the pixel electrode 191 may be in contact with the auxiliary layer 370B in the spaced region.

A width between the light emission layer 370A and the auxiliary layer 370B which are positioned on the upper surface of the inorganic layer 350 may be about 0.1 μm or more, e.g., about 0.5 μm or more. In particular, a width of a region which does not overlap with the light emission layer 370A and the auxiliary layer 370B on the upper surface of the inorganic layer 350 may be about 0.1 μm or more, e.g., about 0.5 μm or more. However, the width is not limited thereto and may be changed according to a process of manufacturing each component.

When the pixel electrode 191 is an anode, the auxiliary layer 370B may include at least one of the hole transport region and the hole injection region. When the pixel electrode 191 is a cathode, the auxiliary layer 370B may include at least one of the electron transport region and the electron injection region.

At least one of the hole injection region and the hole transport region included in the auxiliary layer 370B may be the same material as the hole injection region and the hole transport region included in the light emission layer 370A. In addition, at least one of the electron injection region and the electron transport region included in the auxiliary layer 370B may be the same material as the electron injection region and the electron transport region included in the light emission layer 370A. Embodiments are not limited thereto, and the light emission layer 370A and the auxiliary layer 370B may include different materials. The hole transport region, the hole injection region, the electron transport region, and the electron injection region may include inorganic materials.

The auxiliary layer 370B does not include the light emission region unlike the light emission layer 370A. Even when a voltage is applied to the pixel electrode 191 and the common electrode 270, the auxiliary layer 370B does not include the light emission region and thus, the exciton is not formed. However, the auxiliary layer 370B may include an inorganic material. The auxiliary layer 370B covers the side surface of the pixel defining layer 360 adjacent to the light emission region to reduce the outgas from being discharged from the pixel defining layer 360.

A manufacturing method will be described with reference to FIGS. 7 and 8 with respect to the aforementioned exemplary embodiment described with reference to FIGS. 5 and 6. The substrate 110, thin film transistor, planarization layer 180, pixel electrode 191, and pixel defining layer 360 may be manufactured using any convenient method.

Referring to FIG. 7, the inorganic layer 350 may be formed on the pixel electrode 191. Thereafter, a first layer A including at least one of a hole transport region and a hole injection region may be formed using a first fine metal mask (FMM). According to an exemplary embodiment, the first layer A may include at least one of an electron transport region and an electron injection region.

The first layer A may overlap with the side surface of the pixel defining layer 360 and a part of the upper surface of the pixel defining layer 360. The first layer A may fully cover the inorganic layer 350. In addition, the first layer A may overlap with the pixel electrode 191.

Thereafter, a photosensitive mask PR for patterning is formed on the pixel defining layer 360 and the first layer A. The photosensitive mask PR may overlap with a part of the inorganic layer 350, a part of the first layer A, and the pixel defining layer 360.

Thereafter, as illustrated in FIG. 8, the auxiliary layer 370B may be formed through an etching process using the photosensitive mask PR. The auxiliary layer 370B may overlap with a part of the inorganic layer 350 and a part of the pixel defining layer 360.

Thereafter, the light emission layer 370A spaced apart from the auxiliary layer 370B is formed using a second fine metal mask. The light emitting diode display according to the exemplary embodiment of FIG. 5 may be manufactured by forming sequentially the common electrode 270 and the thin film encapsulation layer 390 on the light emission layer 370A and the auxiliary layer 370B.

Figure 9:
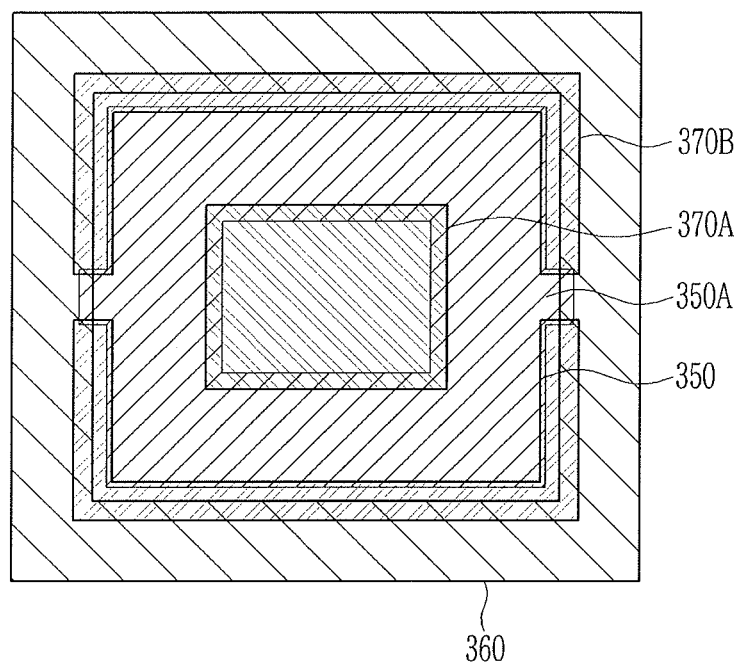
FIG. 9 illustrates a plan view according to a modified example of FIG. 6.
Figure 10:
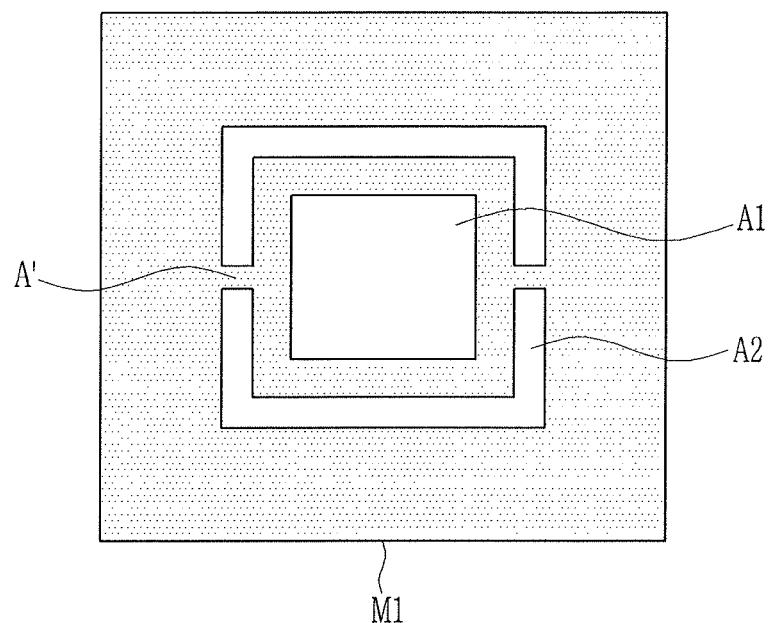
FIGS. 10 and 11 illustrate masks used in a process of manufacturing the light emitting diode display of FIG. 9.
Figure 11:
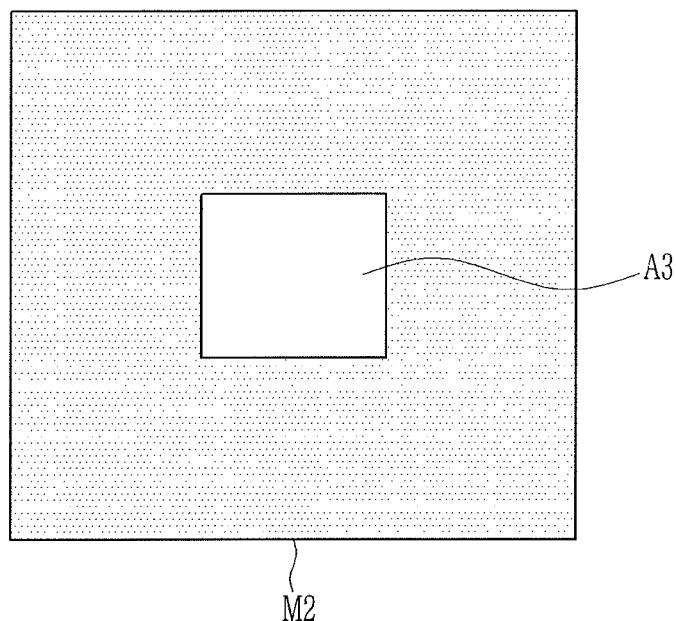

Hereinafter, a light emitting diode display according to an exemplary embodiment will be described with reference to FIGS. 9 to 11. FIG. 9 is a plan view according to a modified example of FIG. 6, and FIGS. 10 and 11 are masks used in a process of manufacturing the light emitting diode display according to the exemplary embodiment of FIG. 9, respectively. The description for the same components as the aforementioned exemplary embodiment will be omitted.

Referring to FIG. 9, one pixel may include at least two auxiliary layers 370B which are spaced apart from each other. The auxiliary layers 370B according to the exemplary embodiment of FIG. 6 are connected to each other, but the auxiliary layers 370B according to the exemplary embodiment of FIG. 9 may be spaced apart from each other.

According to an exemplary embodiment, the inorganic layer 350 may further include a protrusion 350A. The protrusion 350A may be positioned between the two auxiliary layers 370B which are spaced apart from each other.

The protrusion 350A may overlap with the pixel defining layer 360 according to an exemplary embodiment. The inorganic layer 350 may overlap with the auxiliary layer 370B and the light emission layer 370A. In addition, the inorganic layer 350 may overlap with the pixel defining layer 360 in a region where the protrusion 350A is positioned.

In the exemplary embodiment of FIG. 9, the light emission layer 370A may include a light emission region, at least one of a hole injection region and a hole transport region, and at least one of an electron transport region and an electron injection region. According to an exemplary embodiment, the light emission layer 370A may include the hole injection region, the hole transport region, the light emission region, the electron transport region, and the electron injection region which are sequentially stacked.

The auxiliary layer 370B may include one to four regions selected from the hole injection region, the hole transport region, the light emission region, the electron transport region, and the electron injection region. The auxiliary layer 370B does not perform a light emitting function because at least one of the plurality of regions included in the light emission layer 370A is not included, and may simply serve as an inorganic layer.

A method of manufacturing the light emission layer 370A and the auxiliary layer 370B described above will be described with reference to FIGS. 10 and 11.

As illustrated in FIG. 10, a first fine metal mask M1 having a first opening A1 corresponding to a region where the light emission layer 370A is positioned and a second opening A2 corresponding to a region where the auxiliary layer 370B is positioned is prepared. As illustrated in FIG. 11, a second fine metal mask M2 having a third opening A3 corresponding to a region where the light emission layer 370A is positioned without having an opening corresponding to a region where the auxiliary layer 370B is positioned is prepared.

At least one of the hole transport region, the hole injection region, the light emission region, the electron injection region, and the electron transport region is deposited using the first fine metal mask M1. Further, at least one selected from the hole transport region, the hole injection region, the light emission region, the electron injection region, and the electron transport region is deposited using the second fine metal mask M2. In the manufacturing process, each of the first fine metal mask M1 and the second fine metal mask M2 may be used at least one time.

In the case of using both the first fine metal mask M1 and the second fine metal mask M2, the hole transport region, the hole injection region, the light emission region, the electron injection region, and the electron transport region all may be formed in the light emission layer 370A. Meanwhile, one region deposited using the second fine metal mask M2 may not be deposited in a region where the auxiliary layer 370B is positioned. The auxiliary layer 370B may not include at least one of the hole transport region, the hole injection region, the light emission region, the electron injection region, and the electron transport region which are deposited using the second fine metal mask M2.

The auxiliary layer 370B does not include at least one of regions required for functioning as the light emission layer. Accordingly, the auxiliary layer 370B may be a layer in which an inorganic material is simply deposited. The auxiliary layer 370B may block outgas generated from an organic layer such as the pixel defining layer 360 and does not have an exciton like the light emission layer 370A.

Figure 12:
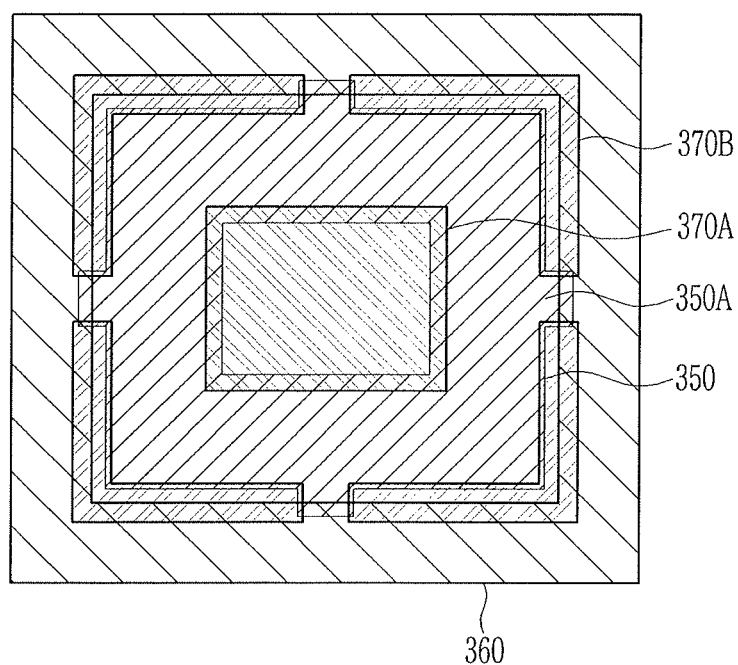
FIGS. 12, 13, and 14 illustrate plan views according to a modified example of FIG. 9.
Figure 13:
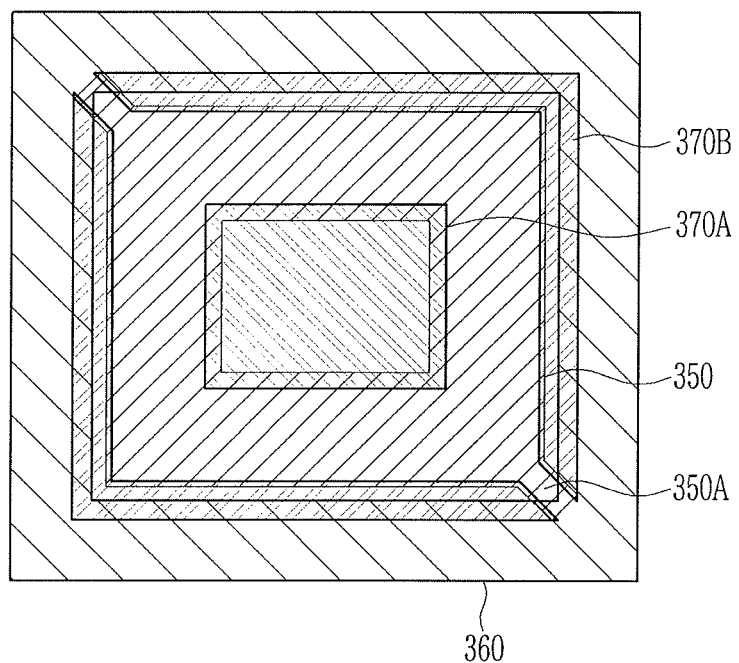
Figure 14:
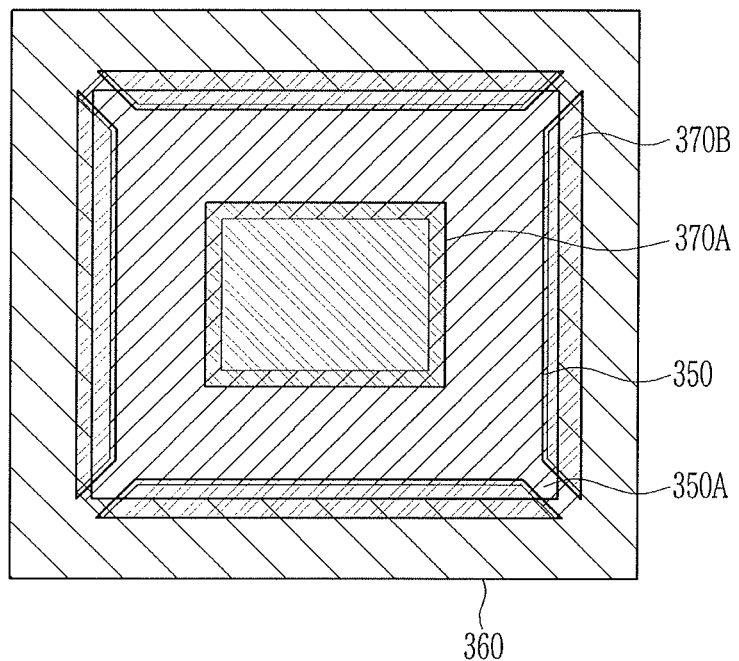

Hereinafter, a light emitting diode display according to an exemplary embodiment will be described with reference to FIGS. 12 to 14. FIGS. 12, 13, and 14 are plan views according to a modified example of FIG. 9. The description for the aforementioned components may be omitted.

Referring to FIG. 12, one pixel according to an exemplary embodiment may include four auxiliary layers 370B which are spaced apart from each other on a plane. Each auxiliary layer 370B may have a '¬' shape or a 'rotated ¬' shape on a plane, e.g., each auxiliary layer 370B may have a rotated L-shape in a top plan view. A plurality of auxiliary layers 370B may be arranged to have a symmetrical shape around a center of the light emission layer 370A in a top plan view.

The inorganic layer 350 positioned between the plurality of auxiliary layers 370B and the light emission layer 370A may have a quadrangular frame shape in a top plan view. In addition, the inorganic layer 350 may include a portion 350A positioned between the two auxiliary layers 370B spaced apart from each other.

Referring to FIG. 13, the auxiliary layer 370B according to the exemplary embodiment may include two auxiliary layers 370B which are spaced apart from each other on a plane. Each auxiliary layer 370B may have a '⌐' or 'L' shape, e.g., each auxiliary layer 370B may have a rotated L-shape in a top plan view. The plurality of auxiliary layers 370B may be symmetrical to each other.

The inorganic layer 350 positioned between the light emission layer 370A and the auxiliary layer 370B may have a quadrangular frame shape in a top plan view. Further, the inorganic layer 350 may include a protrusion 350A overlapping with a space which is spaced between the auxiliary layers 370B. According to an exemplary embodiment, the inorganic layer 350 may include a protrusion 350A which protrudes in a diagonal direction from an apex, e.g., corner, of the quadrangular frame shape.

Referring to FIG. 14, one pixel according to an exemplary embodiment may include four auxiliary layers 370B which are spaced apart from each other. Each auxiliary layer 370B may have a linear shape, e.g., a straight line shape. The plurality of auxiliary layers 370B may be symmetrical to each other.

The inorganic layer 350 positioned between the light emission layer 370A and the auxiliary layer 370B may have a quadrangular frame shape in a top plan view. In addition, the inorganic layer 350 may include a protrusion 350A overlapping with a space which is spaced between the auxiliary layers 370B. According to an exemplary embodiment, the inorganic layer 350 may include four protrusions 350A which are extended in a diagonal direction from each apex, e.g., corner, of the quadrangular frame shape.

Figure 15:
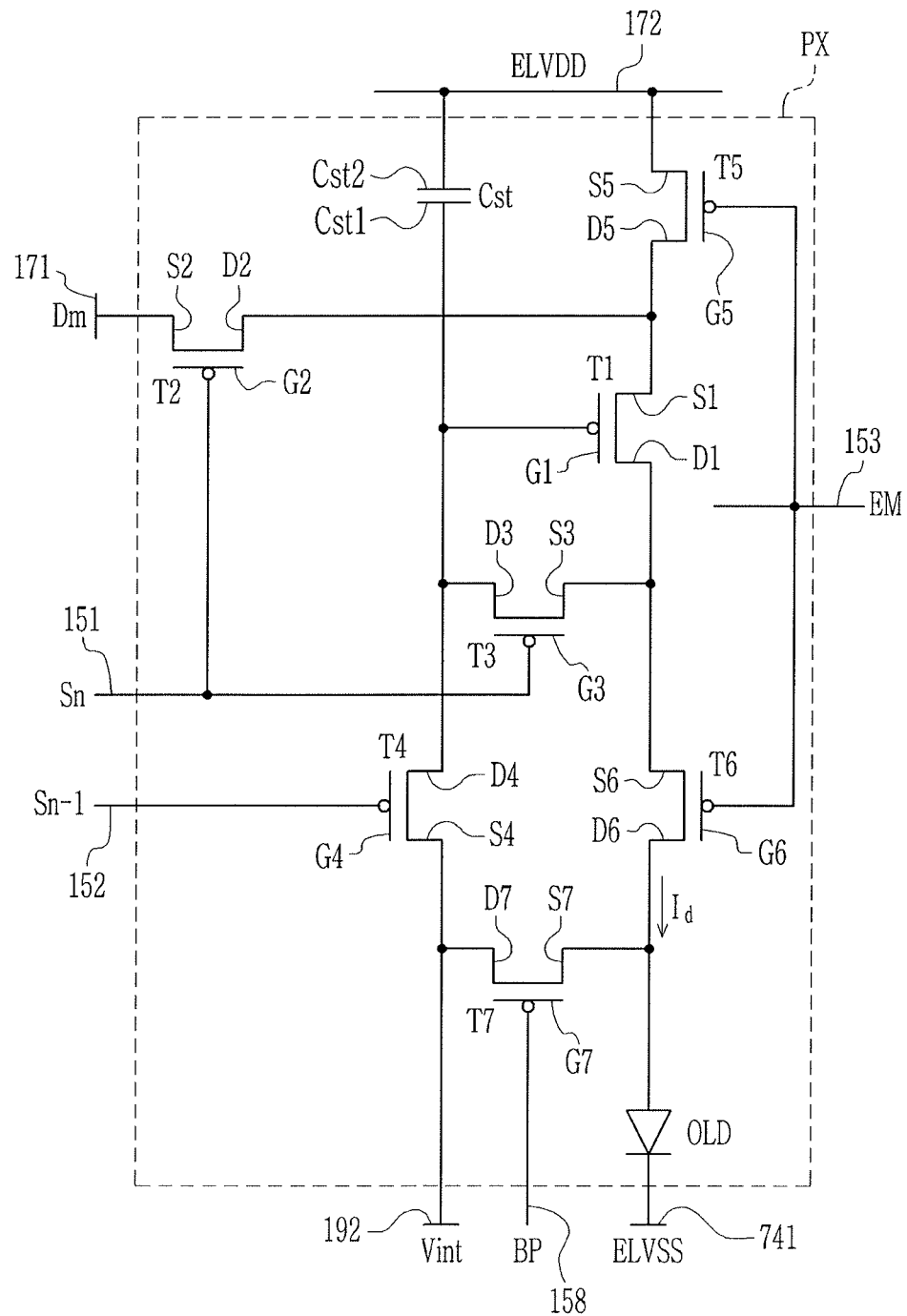
FIG. 15 illustrates an equivalent circuit view of one pixel of a light emitting diode display according to an exemplary embodiment.
Figure 16:
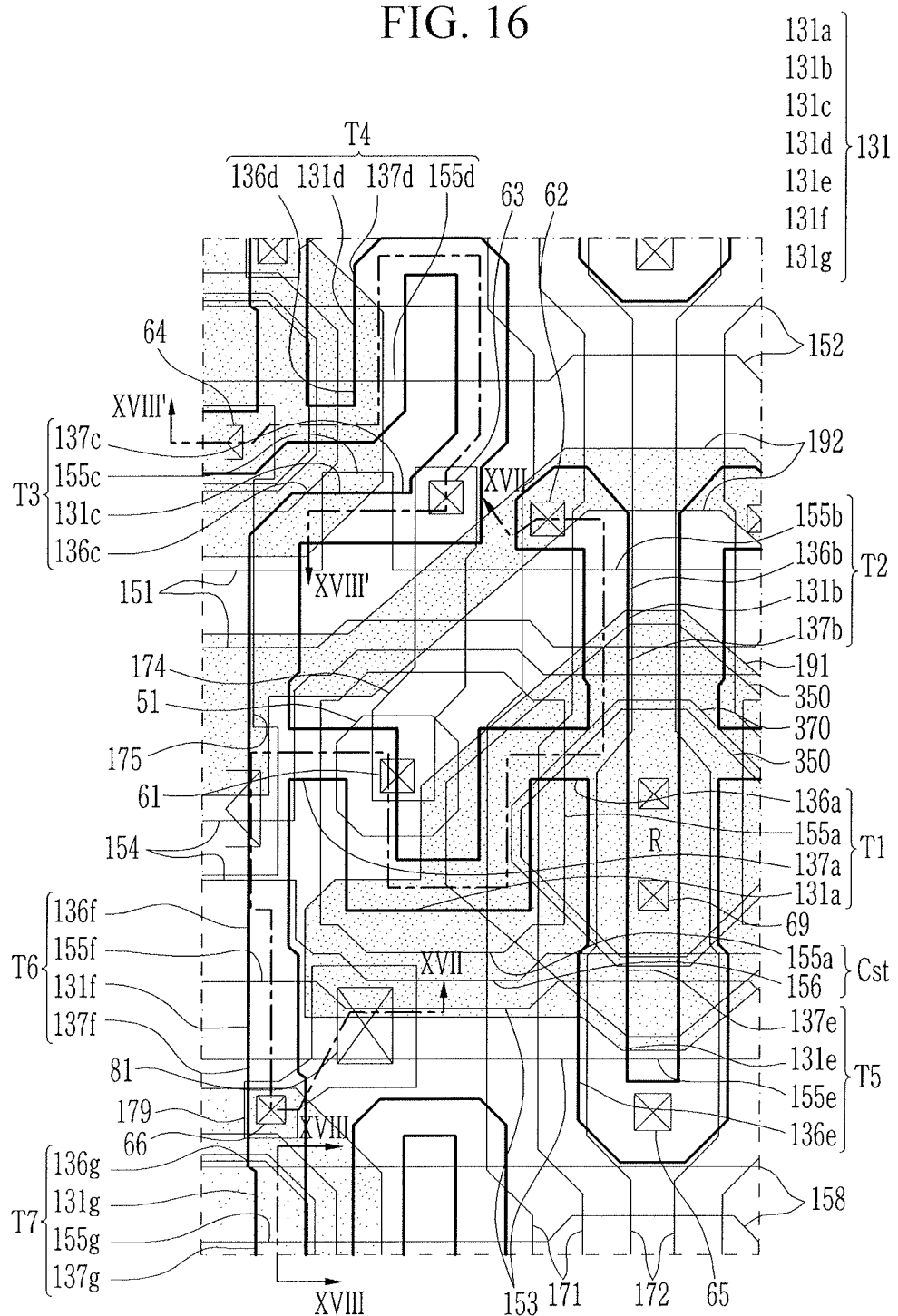
FIG. 16 illustrates a layout view of a transistor and a capacitor of the light emitting diode display according to the exemplary embodiment.
Figure 17:
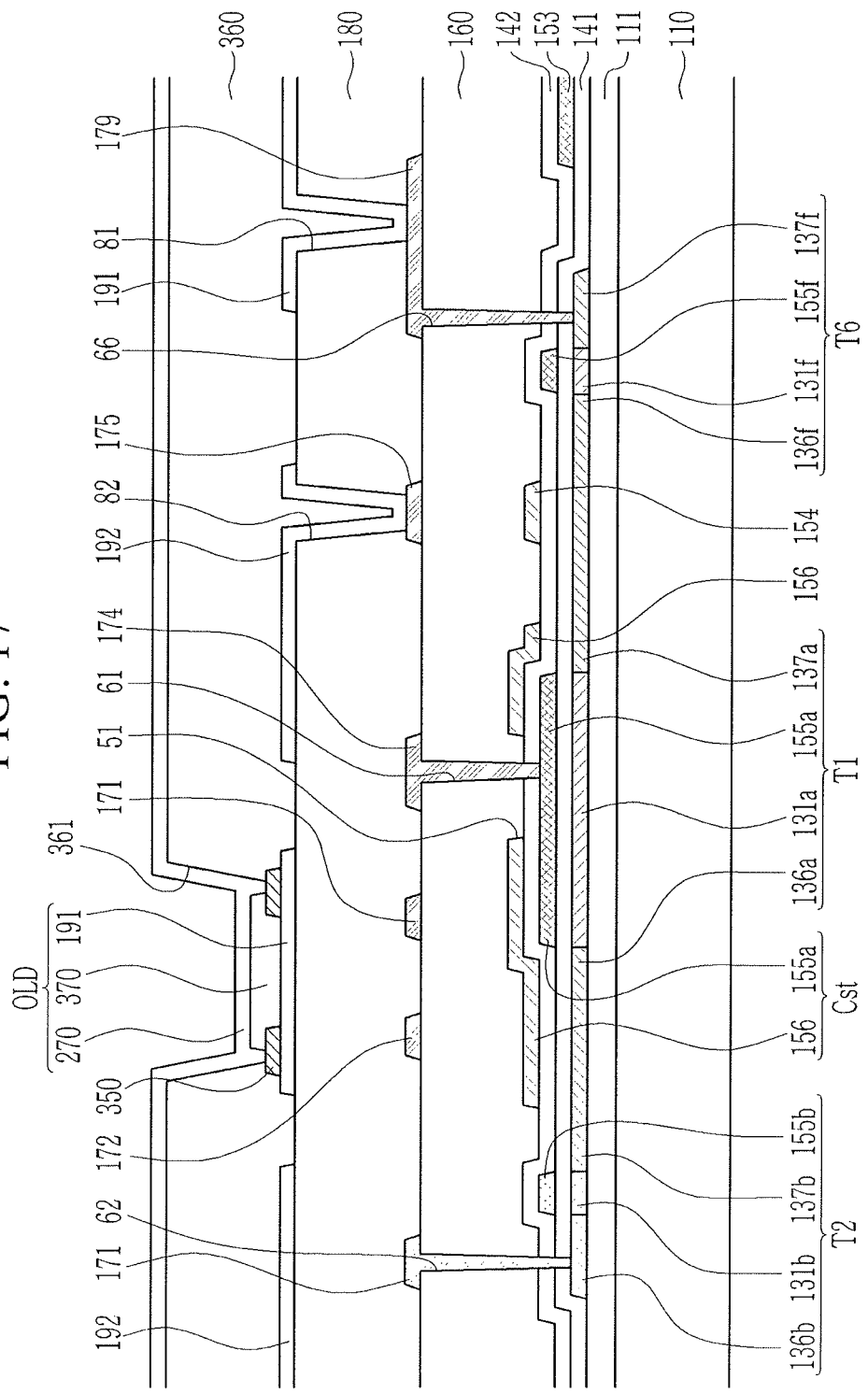
FIG. 17 illustrates a cross-sectional view along line XVII-XVII of FIG. 16.
Figure 18:
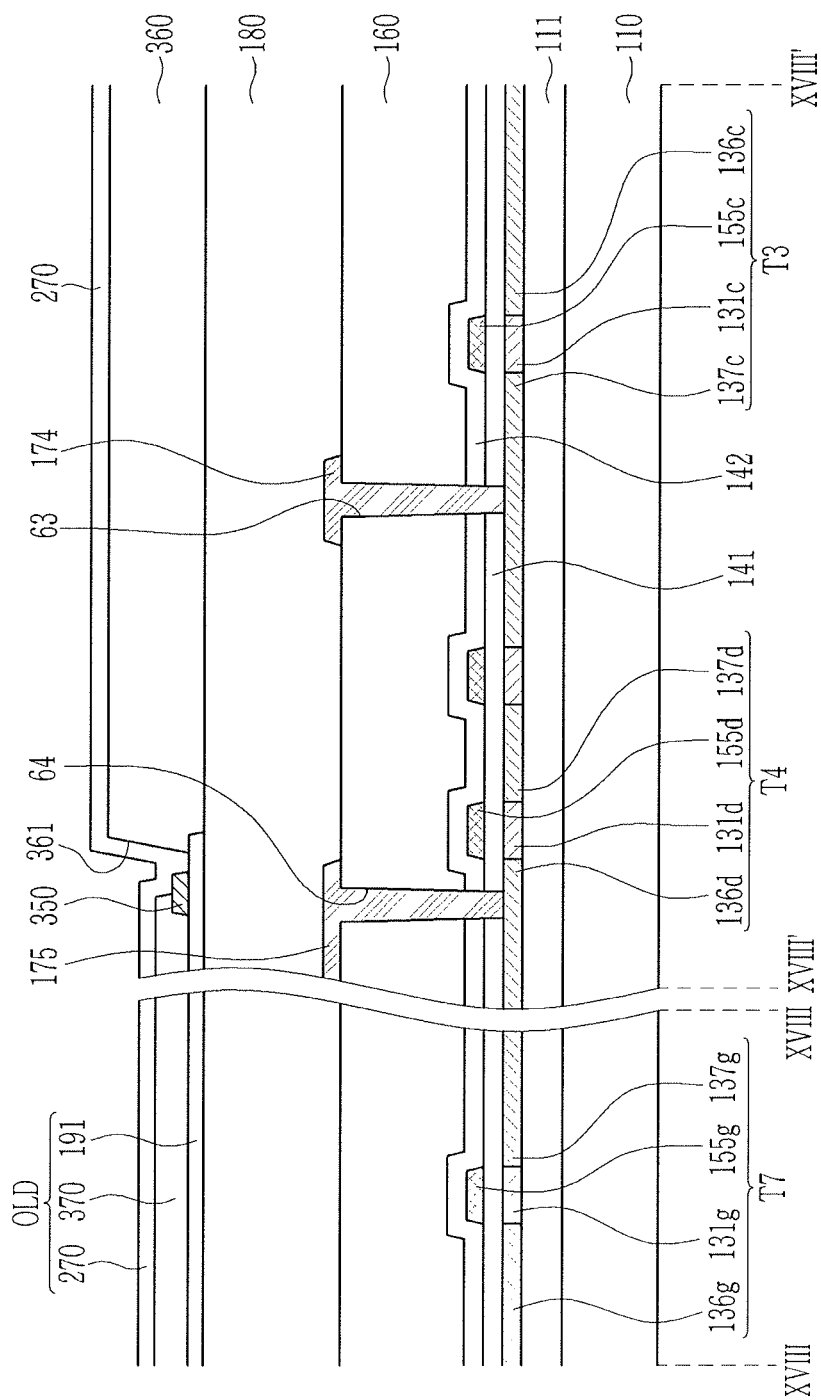
FIG. 18 illustrates a cross-sectional view along lines XVIII-XVIII and XVIII'-XVIII' of FIG. 16.

Hereinafter, a light emitting diode display according to an exemplary embodiment will be described with reference to FIGS. 15 to 18. FIG. 15 is an equivalent circuit view of one pixel of a light emitting diode display according to an exemplary embodiment, FIG. 16 is a layout view of a transistor and a capacitor of the light emitting diode display according to the exemplary embodiment, FIG. 17 is a cross-sectional view of the light emitting diode display of FIG. 16 taken along line XVII-XVII, and FIG. 18 is a cross-sectional view of the light emitting diode display of FIG. 16 taken along lines XVIII-XVIII and XVIII'-XVIII'.

As illustrated in FIG. 15, a light emitting diode display according to an exemplary embodiment includes a plurality of signal lines 151, 152, 153, 158, 171, 172, and 192, and a plurality of pixels PX connected to the plurality of signal lines and arranged in an approximate matrix form. One pixel PX includes a plurality of transistors T1, T2, T3, T4, T5, T6, and T7 connected to the plurality of signal lines 151, 152, 153, 158, 171, 172, and 192, a storage capacitor Cst, and a light emitting diode OLD.

The transistors T1, T2, T3, T4, T5, T6, and T7 include a driving transistor T1, a switching transistor T2, a compensation transistor T3, an initialization transistor T4, an operation control transistor T5, and a light emission control transistor T6, and a bypass transistor T7. The signal lines 151, 152, 153, 158, 171, 172, and 192 include a scan line 151 transferring a scan signal Sn, a previous scan line 152 transferring a previous scan signal Sn−1 to the initialization transistor T4, a light emission control line 153 transferring a light emission control signal EM to the operation control transistor T5 and the light emission control transistor T6, a bypass control line 158 transferring a bypass signal BP to the bypass transistor T7, a data line 171 crossing the scan line 151 and transferring a data signal Dm, a driving voltage line 172 transferring a driving voltage ELVDD and formed to be substantially parallel with the data line 171, and an initialization voltage line 192 transferring an initialization voltage Vint initializing the driving transistor T1.

A gate electrode G1 of the driving transistor T1 is connected with one end Cst1 of the storage capacitor Cst. A source electrode S1 of the driving transistor T1 is connected with the driving voltage line 172 via the operation control transistor T5. A drain electrode D1 of the driving transistor T1 is electrically connected with an anode of the light emitting diode OLD via the light emission control transistor T6. The driving transistor T1 receives a data signal Dm according to a switching operation of the switching transistor T2 to supply a driving current Id to the light emitting diode OLD.

A gate electrode G2 of the switching transistor T2 is connected with the scan line 151. A source electrode S2 of the switching transistor T2 is connected with the data line 171. A drain electrode D2 of the switching transistor T2 is connected with the source electrode S1 of the driving transistor T1 and connected with the driving voltage line 172 via the operation control transistor T5. The switching transistor T2 is turned on according to the scan signal Sn received through the scan line 151 to perform a switching operation that transfers the data signal Dm transferred to the data line 171 to the source electrode S1 of the driving transistor T1.

A gate electrode G3 of the compensation transistor T3 is connected to the scan line 151. A source electrode S3 of the compensation transistor T3 is connected with the drain electrode D1 of the driving transistor T1 and connected with the anode of the light emitting diode OLD via the light emission control transistor T6. A drain electrode D3 of the compensation transistor T3 is connected to a drain electrode D4 of the initialization transistor T4, one end Cst1 of the storage capacitor Cst, and the gate electrode G1 of the driving transistor T1. The compensation transistor T3 is turned on according to the scan signal Sn received through the scan line 151 and connects the gate electrode G1 and the drain electrode D1 of the driving transistor T1 to connect the driving transistor T1.

A gate electrode G4 of the initialization transistor T4 is connected with the previous scan line 152. A source electrode S4 of the initialization transistor T4 is connected with the initialization voltage line 192. A drain electrode D4 of the initialization transistor T4 is connected to one end Cst1 of the storage capacitor Cst and the gate electrode G1 of the driving transistor T1 via the drain electrode D3 of the compensation transistor T3. The initialization transistor T4 is turned on according to the previous scan signal Sn−1 received through the previous scan line 152 to transfer the initialization voltage Vint to the gate electrode G1 of the driving transistor T1 and initializes a gate voltage of the gate electrode G1 of the driving transistor T1.

A gate electrode G5 of the operation control transistor T5 is connected with the light emission control line 153. A source electrode S5 of the operation control transistor T5 is connected with the driving voltage line 172. A drain electrode D5 of the operation control transistor T5 is connected to the source electrode S1 of the driving transistor T1 and the drain electrode D2 of the switching transistor T2.

A gate electrode G6 of the light emission control transistor T6 is connected with the light emission control line 153. A source electrode S6 of the light emission control transistor T6 is connected with the drain electrode D1 of the driving transistor T1 and the source electrode S3 of the compensation transistor T3. A drain electrode D6 of the light emission control transistor T6 is electrically connected with the anode of the light emitting diode OLD.

The operation control transistor T5 and the light emission control transistor T6 are simultaneously turned on according to the light emission control signal EM received through the light emission control line 153. As a result, the driving voltage ELVDD is compensated through the diode-connected driving transistor T1 to be transferred to the light emitting diode OLD.

A gate electrode G7 of the bypass transistor T7 is connected with the bypass control line 158. A source electrode S7 of the bypass transistor T7 is connected to the drain electrode D6 of the light emission control transistor T6 and the anode of the light emitting diode OLD. A drain electrode D7 of the bypass transistor T7 is connected to the initialization voltage line 192 and the source electrode S4 of the initialization transistor T4.

The other end Cst2 of the storage capacitor Cst is connected with the driving voltage line 172 and the cathode of the light emitting diode OLD is connected with a common voltage line 741 transferring a common voltage ELVSS.

In this specification, the structure having 7 transistors including the bypass transistor T7 and 1 capacitor is illustrated, but embodiments are not limited thereto and the number of transistors and the number of capacitors may be variously modified.

Hereinafter, a planar structure of the light emitting diode display according to the exemplary embodiment will be first described in detail with reference to FIG. 16 in addition to FIG. 15 described above.

The light emitting diode display according to the exemplary embodiment includes the scan line 151, the previous scan line 152, the light emission control line 153 and the bypass control line 158 which apply the scan signal Sn, the previous scan signal Sn−1, the light emission control signal EM, and the bypass signal BP to a pixel, respectively, and are extended in a row direction. In addition, the light emitting diode display includes the data line 171 and the driving voltage line 172 which cross the scan line 151, the previous scan line 152, the light emission control line 153, and the bypass control line 158 and apply a data signal Dm and a driving voltage ELVDD to the pixel, respectively. The initialization voltage line 192 transferring the initialization voltage Vint may have a shape which is bent many times in the row direction. The initialization voltage Vint transferred from the initialization voltage line 192 may be transferred to the compensation transistor T3 via the initialization transistor T4.

The pixel includes the driving transistor T1, the switching transistor T2, the compensation transistor T3, the initialization transistor T4, the operation control transistor T5, the light emission control transistor T6, the bypass transistor T7, the storage capacitor Cst, and the light emitting diode. The light emitting diode is constituted by the pixel electrode 191, the light emission layer 370 and the common electrode 270.

A channel of each of the driving transistor T1, the switching transistor T2, the compensation transistor T3, the initialization transistor T4, the operation control transistor T5, the light emission control transistor T6, and the bypass transistor T7 is positioned on a single connected semiconductor layer 131. The semiconductor layer 131 may have various curved shapes.

The semiconductor layer 131 includes a channel which is channel-doped with an N-type impurity or a P-type impurity, and a source doping region and a drain doping region which are formed at both sides of the channel and have a doping concentration higher than that of the doping impurity doped in the channel. In the exemplary embodiment, the source doping region and the drain doping region correspond to the source electrode and the drain electrode, respectively. The source electrode and the drain electrodes formed in the semiconductor layer 131 may be formed by doping only the corresponding regions. Further, in the semiconductor layer 131, regions between source electrodes and drain electrodes of different transistors are doped to electrically connect the source electrode and the drain electrode to each other.

The channels included in the semiconductor layer 131 may include a driving channel 131a included in the driving transistor T1, a switching channel 131b included in the switching transistor T2, a compensation channel 131c included in the compensation transistor T3, an initialization channel 131d included in the initialization transistor T4, an operation control channel 131e included in the operation control transistor T5, a light emission control channel 131f included in the light emission control transistor T6, and a bypass channel 131g included in the bypass transistor T7.

The driving transistor T1 includes the driving channel 131a, a driving gate electrode 155a, a driving source electrode 136a and a driving drain electrode 137a. The driving channel 131a is curved and may have a meandering shape or a zigzag shape.

The driving gate electrode 155a overlaps with the driving channel 131a. The driving source electrode 136a and the driving drain electrode 137a are positioned to be adjacent to both sides of the driving channel 131a. The driving gate electrode 155a is connected with a driving connection member 174 through a driving contact hole 61.

The switching transistor T2 includes the switching channel 131b, a switching gate electrode 155b, a switching source electrode 136b and a switching drain electrode 137b. The switching gate electrode 155b which is a part extended downward from the scan line 151 overlaps with the switching channel 131b. The switching source electrode 136b and the switching drain electrode 137b are positioned to be adjacent to both sides of the switching channel 131b. The switching source electrode 136b is connected with the data line 171 through a switching contact hole 62.

The compensation transistor T3 includes the compensation channel 131c, a compensation gate electrode 155c, a compensation source electrode 136c and a compensation drain electrode 137c. The compensation gate electrode 155c may be a protrusion which is extended upward from the scan line 151. The compensation gate electrode 155c overlaps with the compensation channel 131c. The compensation source electrode 136c and the compensation drain electrode 137c may be positioned at both sides of the compensation channel 131c. The compensation drain electrode 137c is connected with the driving connection member 174 through a compensation contact hole 63.

The initialization transistor T4 includes the initialization channel 131d, an initialization gate electrode 155d, an initialization source electrode 136d and an initialization drain electrode 137d. The initialization gate electrode 155d may be a protrusion which is extended downward from the previous scan line 152. The initialization gate electrode 155d overlaps with the initialization channel 131d. The initialization source electrode 136d and the initialization drain electrode 137d are positioned to be adjacent to both sides of the initialization channel 131d. The initialization source electrode 136d is connected with an initialization connection member 175 through an initialization contact hole 64.

The operation control transistor T5 includes the operation control channel 131e, an operation control gate electrode 155e, an operation control source electrode 136e and an operation control drain electrode 137e. The operation control gate electrode 155e which is a part of the light emission control line 153 overlaps with the operation control channel 131e. The operation control source electrode 136e and the operation control drain electrode 137e are positioned to be adjacent to both sides of the operation control channel 131e. The operation control source electrode 136e is connected with a part of the driving voltage line 172 through an operation control contact hole 65.

The light emission control transistor T6 includes the light emission control channel 131f, a light emission control gate electrode 155f, a light emission control source electrode 136f and a light emission control drain electrode 137f. The light emission control gate electrode 155f which is a part of the light emission control line 153 overlaps with the light emission control channel 131f. The light emission control source electrode 136f and the light emission control drain electrode 137f are positioned to be adjacent to both sides of the light emission control channel 131f. The light emission control drain electrode 137f is connected with a light emission control connection member 179 through a light emission control contact hole 66.

The bypass transistor T7 includes the bypass channel 131g, a bypass gate electrode 155g, a bypass source electrode 136g and a bypass drain electrode 137g. The bypass gate electrode 155g which is a part of the bypass control line 158 overlaps with the bypass channel 131g. The bypass source electrode 136g and the bypass drain electrode 137g are positioned to be adjacent to both sides of the bypass channel 131g. The bypass source electrode 136g is connected with the light emission control connection member 179 through the light emission control contact hole 66. The bypass drain electrode 137g is directly connected with the initialization source electrode 136d.

The driving source electrode 136a of the driving transistor T1 is connected with the switching drain electrode 137b and the operation control drain electrode 137e. The driving drain electrode 137a is connected with the compensation source electrode 136c and the light emission control source electrode 136f.

The storage capacitor Cst includes a first storage electrode 155a and a second storage electrode 156 disposed with the second gate insulating layer 142 therebetween. The first storage electrode 155a corresponds to the driving gate electrode 155a. The second storage electrode 156 as a portion extended from the storage line 154 occupies a larger area than the driving gate electrode 155a and covers fully the driving gate electrode 155a. The second gate insulating layer 142 is a dielectric material and a storage capacitance is determined by charges stored in the storage capacitor Cst and a voltage between both electrodes 155a and 156. The driving gate electrode 155a is used as the first storage electrode 155a to secure a space capable of forming the storage capacitor in a space narrowed by the driving channel 131a occupying a large area in the pixel.

The first storage electrode 155a which is the driving gate electrode 155a is connected to one end of the driving connection member 174 through the driving contact hole 61 and a storage opening 51. The storage opening 51 is an opening formed in the second storage electrode 156.

The driving connection member 174 may be substantially parallel with the data line 171 and positioned on the same layer. The other end of the driving connection member 174 is connected with the compensation drain electrode 137c of the compensation transistor T3 and the initialization drain electrode 137d of the initialization transistor T4 through the compensation contact hole 63. The driving connection member 174 connects the driving gate electrode 155a, the compensation drain electrode 137c of the compensation transistor T3, and the initialization drain electrode 137d of the initialization transistor T4 to each other.

The second storage electrode 156 is connected with the driving voltage line 172 through a storage contact hole 69. The storage capacitor Cst may store a storage capacitance corresponding to a difference between the driving voltage ELVDD transferred to the second storage electrode 156 through the driving voltage line 172 and the driving gate voltage of the driving gate electrode 155a.

Hereinafter, a cross-sectional structure of a light emitting diode display according to an exemplary embodiment will be described in detail according to a stacked order with reference to FIGS. 17 and 18 in addition to FIGS. 15 and 16. Since the operation control transistor T5 is almost the same as the stacked structure of the light emission control transistor T6, the detailed description will be omitted.

A buffer layer 111 is positioned on the substrate 110. The buffer layer 111 blocks impurities from the substrate 110 in a crystallization process of forming polycrystal silicon. Further, a stress of the semiconductor layer positioned on the buffer layer 111 may be alleviated by planarizing one surface of the substrate 110. The buffer layer 111 may include an inorganic material such as silicon nitride (SiNx) or silicon oxide (SiOx).

On the buffer layer 111, the semiconductor layer including the driving channel 131a, the switching channel 131b, the compensation channel 131c, the initialization channel 131d, the operation control channel 131e, the light emission control channel 131f and the bypass channel 131g is positioned.

The driving source electrode 136a and the driving drain electrode 137a are positioned at both sides of the driving channel 131a. The switching source electrode 136b and the switching drain electrode 137b are positioned at both sides of the switching channel 131b. The compensation source electrode 136c and the compensation drain electrode 137c are positioned at both sides of the compensation channel 131c. The initialization source electrode 136d and the initialization drain electrode 137d are positioned at both sides of the initialization channel 131d. The operation control source electrode 136e and the operation control drain electrode 137e are positioned at both sides of the operation control channel 131e. The light emission control source electrode 136f and the light emission control drain electrode 137f are positioned at both sides of the light emission control channel 131f. The bypass source electrode 136g and the bypass drain electrode 137g are positioned at both sides of the bypass channel 131g.

A first gate insulating layer 141 is positioned on the semiconductor layer.

On the first gate insulating layer 141, a first gate conductor including the scan line 151 including the switching gate electrode 155b and the compensation gate electrode 155c, the previous scan line 152 including the initialization gate electrode 155d, the light emission control line 153 including the operation control gate electrode 155e and the light emission control gate electrode 155f, the bypass control line 158 including the bypass gate electrode 155g, and the driving gate electrode (first storage electrode) 155a is positioned.

The second gate insulating layer 142 is positioned on the first gate conductor and the first gate insulating layer 141. The first gate insulating layer 141 and the second gate insulating layer 142 may include silicon nitride (SiNx), silicon oxide $SiO_2$, or the like.

On the second gate insulating layer 142, a second gate conductor including the storage line 154 parallel with the scan line 151, and the second storage electrode 156 which is the portion extended from the storage line 154 is positioned.

An interlayer insulating layer 160 is positioned on the second gate insulating layer 142 and the second gate conductor. The interlayer insulating layer 160 may have the driving contact hole 61, the switching contact hole 62, the compensation contact hole 63, the initialization contact hole 64, the operation control contact hole 65, the light emission control contact hole 66 and the storage contact hole 69.

On the interlayer insulating layer 160, a data conductor including the data line 171, the driving voltage line 172, the driving connection member 174, the initialization connection member 175 and the light emission control connection member 179 is positioned.

The data line 171 is connected with the switching source electrode 136b through the switching contact hole 62. One end of the driving connection member 174 is connected with the first storage electrode 155a through the driving contact hole 61. The other end of the driving connection member 174 is connected with the compensation drain electrode 137c and the initialization drain electrode 137d through the compensation contact hole 63. The initialization connection member 175 is connected with the initialization source electrode 136d through the initialization contact hole 64. The light emission control connection member 179 is connected with the light emission control drain electrode 137f through the light emission control contact hole 66.

The planarization layer 180 is positioned on the data conductor and the interlayer insulating layer 160. The planarization layer 180 planarizes one surface by covering the data conductor, and thus, the pixel electrode 191 may be formed on the planarization layer 180 without a step. The planarization layer 180 may have a thickness larger than that of the interlayer insulating layer 160 and minimize a parasitic capacitance between the data conductor and the pixel electrode 191. The planarization layer 180 may include an organic material, e.g., polyacrylates resin and polyimides resin or a stacked film of an organic material and an inorganic material.

The pixel electrode 191 and the initialization voltage line 192 are positioned on the planarization layer 180. The light emission control connection member 179 is connected with the pixel electrode 191 through a pixel contact hole 81. The initialization connection member 175 is connected with the initialization voltage line 192 through the initialization voltage line contact hole 82.

The pixel defining layer 360 is positioned on the pixel electrode 191. The pixel defining layer 360 has an opening 361 exposing the pixel electrode 191. The pixel defining layer 360 may include an organic material, e.g., polyacrylates resin and polyimides resin or a silica-based inorganic material.

The light emission layer 370 may be positioned on the pixel electrode 191. The inorganic layer 350 may be positioned between the light emission layer 370 and the pixel electrode 191. Since the inorganic layer 350 according to the exemplary embodiment is the same as the inorganic layer 350 described in FIG. 1, the detailed description will be hereinafter omitted.

In this specification, the example in which the inorganic layer 350 according to the exemplary embodiment of FIG. 1 is applied is illustrated, but embodiments are not limited thereto. Components for the pixel electrode 191, the inorganic layer 350, the pixel defining layer 360, and the like described in FIGS. 3 to 14 may be applied.

The common electrode 270 is positioned on the light emission layer 370. The common electrode 270 is also positioned on the pixel defining layer 360 and positioned over a plurality of pixels. The light emitting diode OLD including the pixel electrode 191, the light emission layer 370, and the common electrode 270 may be formed.

Herein, the pixel electrode 191 may be an anode which is a hole injection hole and the common electrode 270 may be a cathode which is an electron injection electrode. Embodiments are not limited thereto, and according to a driving method of the light emitting diode display, the pixel electrode 191 may be the cathode and the common electrode 270 may also be the anode. A hole and an electron are injected into the light emission layer 370 from the pixel electrode 191 and the common electrode 270, respectively, and when an exciton in which the injected hole and electron are coupled to each other falls from an excited state to a ground state, the light is emitted.

By way of summation and review, embodiments provide a light emitting diode display including a light emission layer surrounded by an inorganic material. That is, according to the aforementioned exemplary embodiment, the light emission layer may include a structure, e.g., completely, surrounded by an inorganic material to prevent the performance of the light emission layer from being deteriorated due to penetration of outgas. In other words, since the light emission layer is surrounded by the inorganic material, it is possible to reduce deterioration due to outgas emitted from a layer including an organic material, e.g., a pixel defining layer. Further, it is possible to provide a light emitting diode display with improved quality.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A light emitting diode display, comprising:
   a first electrode;
   a second electrode overlapping the first electrode;
   a light emission layer between the first electrode and the second electrode;
   a pixel defining layer overlapping a part of the first electrode, the pixel defining layer and the light emission layer being spaced apart from each other; and
   an inorganic layer between the first electrode and the second electrode, wherein
   the second electrode is in contact with the inorganic layer in a region between the pixel defining layer and the light emission layer.
2. The light emitting diode display as claimed in claim 1, wherein the light emission layer is surrounded by the first electrode, the inorganic layer, and the second electrode.
3. The light emitting diode display as claimed in claim 1, wherein the edge of the light emission layer and the edge of the pixel defining layer are positioned on one surface of the inorganic layer.
4. The light emitting diode display as claimed in claim 1, wherein the inorganic layer overlaps with the first electrode.
5. The light emitting diode display as claimed in claim 1, further comprising:
   a thin film transistor connected with the first electrode; and
   a planarization layer on the thin film transistor, a part of the inorganic layer being between the pixel defining layer and the planarization layer.

* * * * *